United States Patent
Nakamura et al.

(10) Patent No.: US 6,851,599 B2
(45) Date of Patent: Feb. 8, 2005

(54) METHOD FOR PRODUCING MULTILAYER WIRING CIRCUIT BOARD

(75) Inventors: Kei Nakamura, Osaka (JP); Satoshi Tanigawa, Osaka (JP); Shinya Oota, Osaka (JP)

(73) Assignee: Nitto Denko Corporation, Osaka (JP)

( * ) Notice: Subject to any disclaimer, the term of this patent is extended or adjusted under 35 U.S.C. 154(b) by 6 days.

(21) Appl. No.: 10/363,167

(22) PCT Filed: Jul. 3, 2002

(86) PCT No.: PCT/JP02/06718
§ 371 (c)(1),
(2), (4) Date: Mar. 5, 2003

(87) PCT Pub. No.: WO03/005789
PCT Pub. Date: Jan. 16, 2003

(65) Prior Publication Data
US 2004/0011855 A1 Jan. 22, 2004

(51) Int. Cl.$^7$ ............................................... B23K 31/02
(52) U.S. Cl. .................................... 228/248.1; 228/175
(58) Field of Search .......................... 228/248.1, 248.5, 228/175, 179.1, 180.1, 180.22; 156/60; 427/96

(56) References Cited

U.S. PATENT DOCUMENTS

| | | | | |
|---|---|---|---|---|
| 4,642,160 A | * | 2/1987 | Burgess ....................... | 216/18 |
| 5,451,721 A | * | 9/1995 | Tsukada et al. .............. | 174/261 |
| 5,719,749 A | * | 2/1998 | Stopperan .................... | 361/769 |
| 5,949,142 A | * | 9/1999 | Otsuka ......................... | 257/737 |
| 6,207,259 B1 | * | 3/2001 | Iino et al. .................... | 428/209 |
| 6,362,436 B1 | * | 3/2002 | Kimbara et al. ............. | 174/260 |
| 2002/0039644 A1 | * | 4/2002 | Kimbara et al. ............. | 428/209 |
| 2002/0136874 A1 | * | 9/2002 | Iwamoto et al. ............ | 428/209 |
| 2004/0011855 A1 | * | 1/2004 | Nakamura et al. .......... | 228/175 |
| 2004/0035520 A1 | * | 2/2004 | Nakamura et al. .......... | 156/182 |

FOREIGN PATENT DOCUMENTS

| | | |
|---|---|---|
| EP | 905763 A2 | 3/1999 |
| EP | 1069811 A2 | 1/2001 |
| JP | 8-228075 A | 9/1996 |
| JP | 2001-28482 | 1/2001 |
| JP | 2001-237512 | 8/2001 |
| JP | 2002261427 A * | 9/2002 |
| JP | 2003086944 A * | 3/2003 |
| JP | 2003347735 A * | 12/2003 |
| WO | WO 03/005789 A1 | 1/2003 |

* cited by examiner

*Primary Examiner*—Kiley S. Stoner
(74) *Attorney, Agent, or Firm*—Jean C. Edwards, Esq.; Dickinson Wright PLLC

(57) ABSTRACT

A method of producing a multilayer wired circuit board that can provide sufficient adhesion strength of the interface between a conductor layer and a thermosetting adhesive layer laminated, to provide improvement in connection strength between the conductor layers and thus improvement in reliability. In this method, after a thermosetting adhesive layer is formed on a first conductor layer, an opening is formed in the thermosetting adhesive layer and solder powders are charged in the opening at normal temperature. Sequentially, a second conductor layer is formed on the thermosetting adhesive layer including the opening filled with the solder powders. Thereafter, the solder powders are melted by heating, to electrically connect between the first conductor layer and the second conductor layer.

1 Claim, 4 Drawing Sheets

(d)

(e)

(f)

(a)

(b)

(c)

(d)

(e)

(f)

(g)

METHOD FOR PRODUCING MULTILAYER WIRING CIRCUIT BOARD

This application is a 35 U.S.C. 371 National Stage entry of PCT/JP02/06718, filed Jul. 3, 2002, which claims priority from Japanese Patent Application No. 2001-204885, filed July 5, 2001, and Japanese Patent Application No. 2002-025864, filed Feb. 1, 2002.

TECHNICAL FIELD

The present invention relates to a method of producing a multilayer wired circuit board.

BACKGROUND ART

A multilayer wired circuit board is formed by laminating a plurality of wired circuit boards, each having an insulating layer and a conductor layer formed in a specific wired circuit pattern on the insulating layer, through an adhesive layer sandwiched therebetween. The conductor layers are electrically connected with each other through conductive passages extending in a thickness direction of the adhesive layers interposed between the conductor layers.

It is typical in the method of producing this multilayer wired circuit board that the wired circuit boards are multi-layered in the lamination process shown in FIG. 4, for example. That is to say, a first wired circuit board 3 having a first insulating layer 1 and a first conductor layer 2 formed in a specific wired circuit pattern on the insulating layer is prepared, first, as shown in FIG. 4(a). Then, a thermosetting adhesive layer 5 is laminated on the first conductor layer 2 of the first wired circuit board 3 in its B-stage state, as shown in FIG. 4(b). Then, an opening 4 is formed in the thermosetting adhesive layer 5, as shown in FIG. 4(c). Thereafter, a solder paste 6 is screen-printed on the opening 4, as shown in FIG. 4(d), and then is melted by heating (reflow soldering) to form a solder bump 7a, as shown in FIG. 4(e). Thereafter, a second wired circuit board 10 having a second insulating layer 8 and a second conductor layer 9 formed in a specific wired circuit pattern on the second insulating layer is positioned to be opposed to the solder bump 7a and laminated on the thermosetting adhesive layer 5, as shown in FIG. 4(f). Then, those laminated layers are heated under pressure to cure the thermosetting adhesive layer 5, as shown in FIG. 4(g), and thereby the first wired circuit board 3 and the second wired circuit board 10 are adhesive bonded together.

In this lamination process, when the solder paste 6 is melted by heating, to form the solder bump 7a, the thermosetting adhesive layer 5 in the B-stage state is reactively cured to some extent. As a result of this, when the second wired circuit board 10 is laminated on the thermosetting adhesive layer 5 and then is heated under pressure, fluidity of the thermosetting adhesive layer 5 is reduced, so that a sufficient adhesion strength of the interface between the second wired circuit board 10 including the second conductor layer 9 and the thermosetting adhesive layer 5 cannot be obtained. As a result of this, an interlayer strength between the first wired circuit board 3 including the first conductor layer 2 and the second wired circuit board 10 including the second conductor layer 9 deteriorates, leading to a possible problem of electrical conductive failure between the layers.

DISCLOSURE OF THE INVENTION

It is the object of the invention to provide a method of producing a multilayer wired circuit board that can provide sufficient adhesion strength of the interface between the conductor layer and the thermosetting adhesive layer, to provide improvement in connection strength between the conductor layers and thus improvement in reliability of a multilayer wired circuit board.

The method of producing a multilayer wired circuit board according to the present invention comprises the step of forming a thermosetting adhesive layer having an opening previously formed therein on a first conductor layer, or forming the thermosetting adhesive layer on the first conductor layer, followed by forming the opening in the thermosetting adhesive layer; the step of charging solder powders in the opening at temperature of 5–50° C.; the step of forming a second conductor layer on the thermosetting adhesive layer including the opening filled with the solder powders; and the step of melting the solder powders by heating to electrically connect between the first conductor layer and the second conductor layer.

According to this method, after the solder powders are charged in the opening of the thermosetting adhesive layer at temperature of 5–50° C., the second conductor layer is formed on the thermosetting adhesive layer. Thus, the thermosetting adhesive layer and the second conductor layer are already laminated with each other when the solder powders are melted by heating in a later stage. Hence, even when the thermosetting adhesive layer is reactively cured further, the adhesion strength of the interface between the thermosetting adhesive layer and the second conductor layer increases as the curing of the thermosetting adhesive layer proceeds. As a result of this, sufficient adhesion strength of the interface between the second conductor layer and the thermosetting adhesive layer is obtained. Consequently, improved connection strength between the first conductor layer and the second conductor layer is provided and thus reduced interlayer conductive failure is provided, thus enabling a multilayer wired circuit board to be produced with high reliability.

Figure 1:
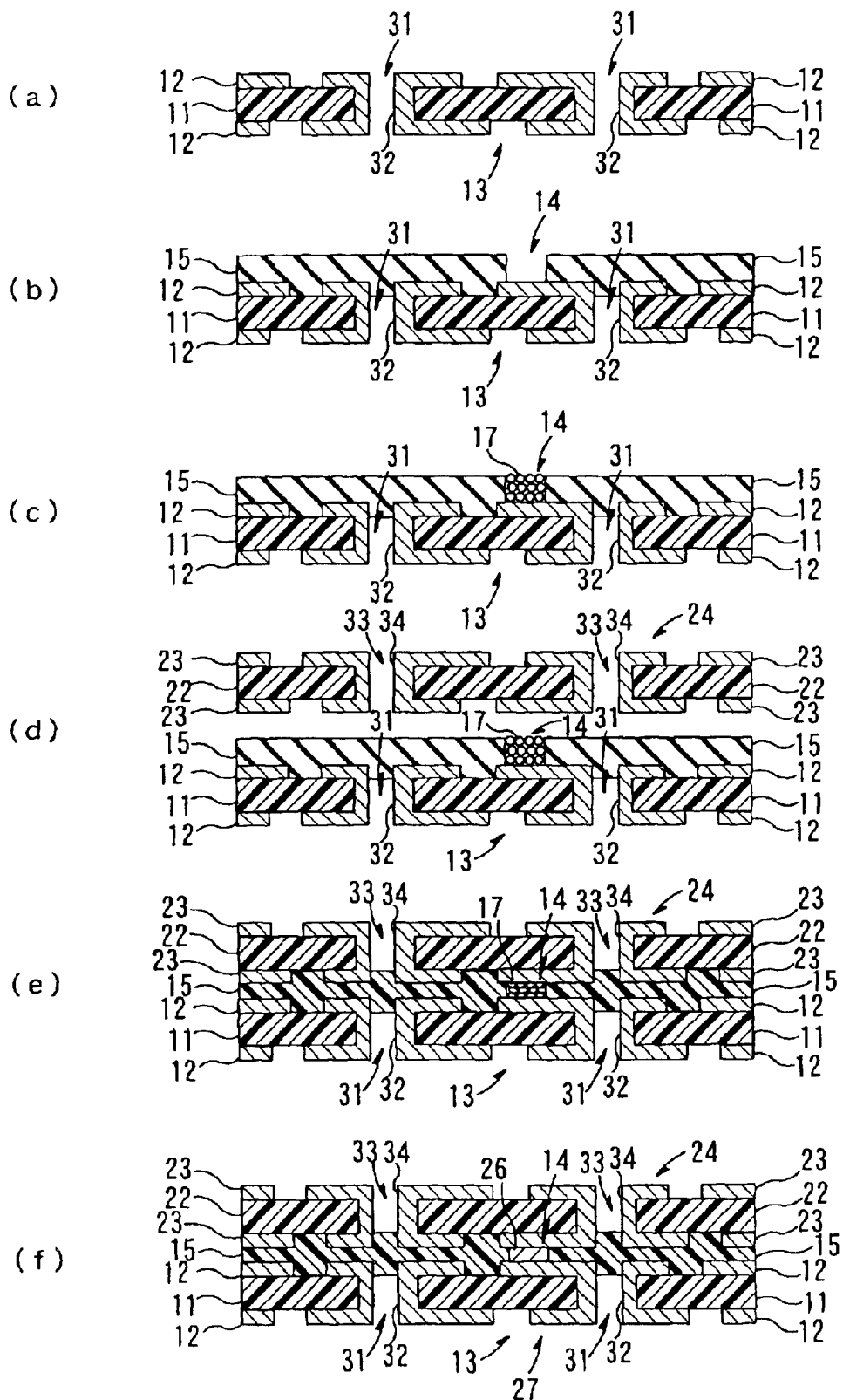
FIG. 1 illustrates a production process of a multilayer wired circuit board producing method of an embodiment of the present invention.
Figure 2:
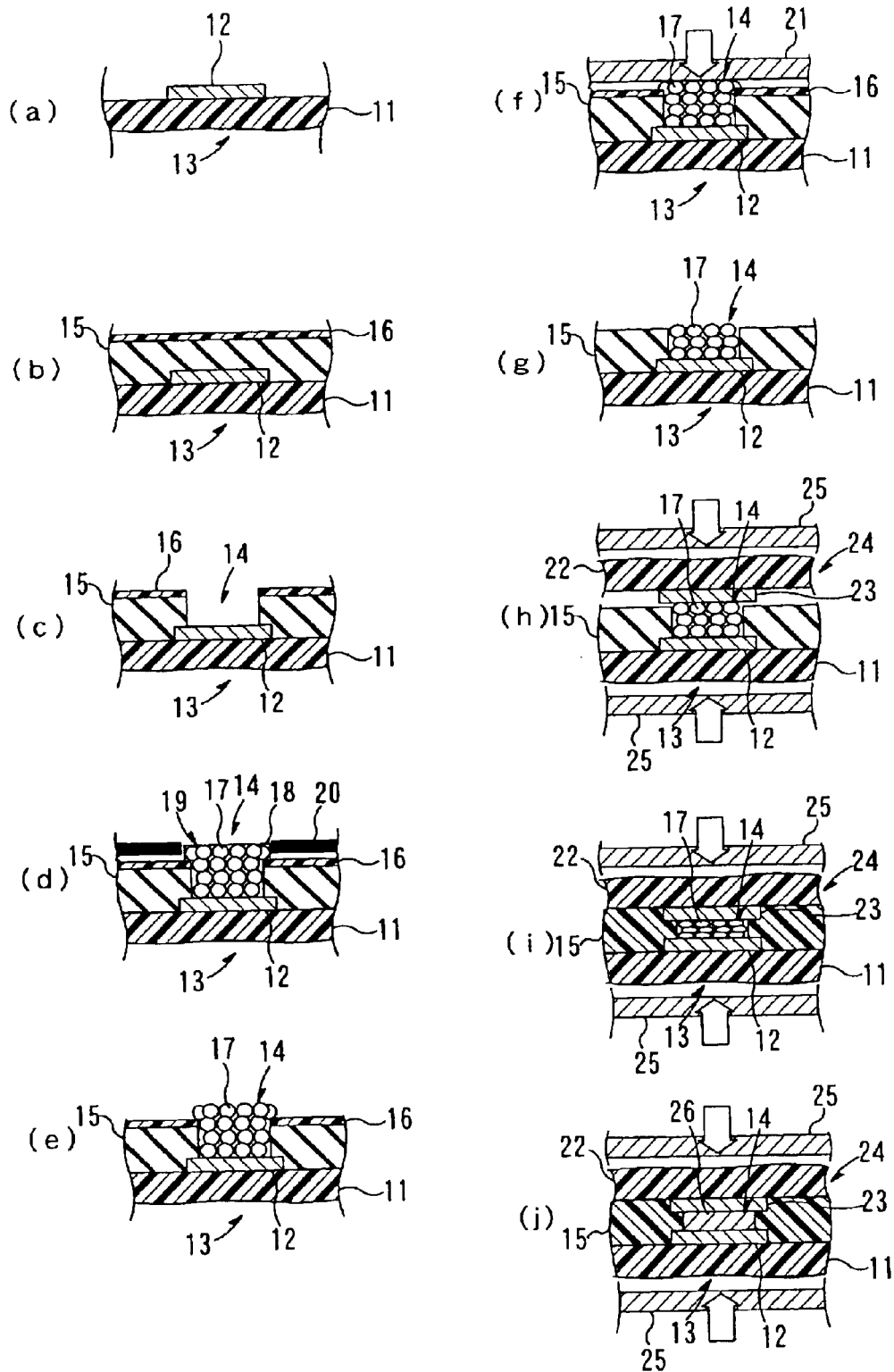
Figure 3:
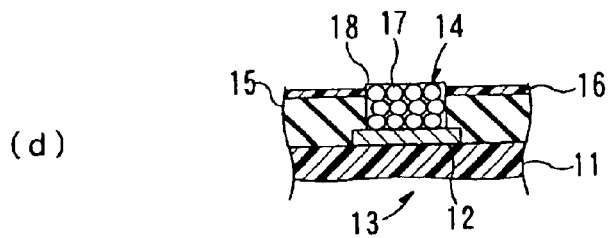
Figure 3:
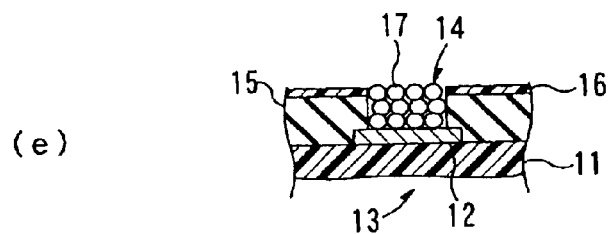
Figure 3:
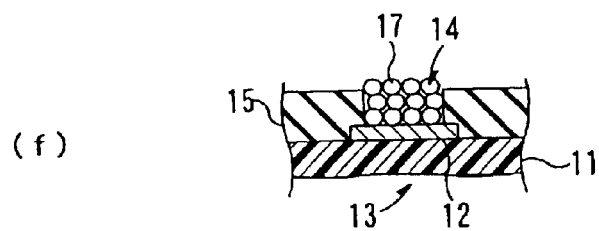
Figure 4:
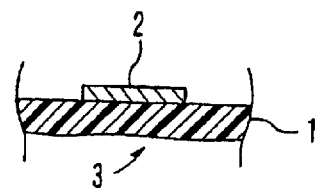
Figure 4:
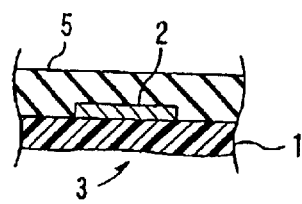
Figure 4:
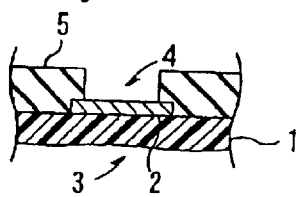
Figure 4:
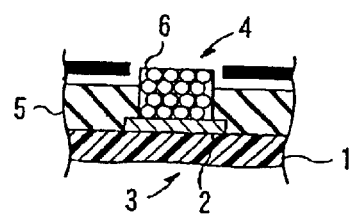
Figure 4:
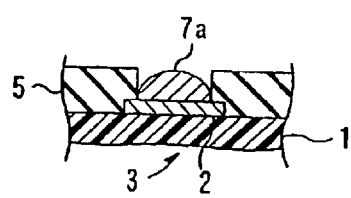
Figure 4:
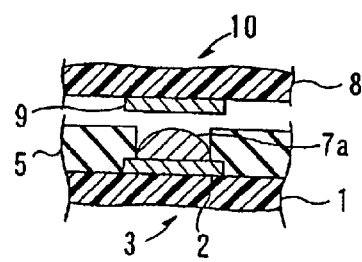
Figure 4:
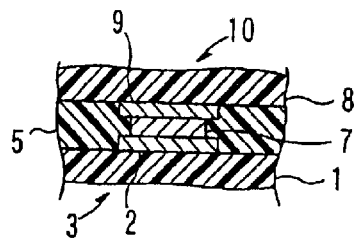

(a) illustrates the process of preparing a first double-sided wired circuit board;

(b) illustrates the process of laminating a thermosetting adhesive layer on one of first conductor layers of the first double-sided wired circuit board and then forming an opening in it;

(c) illustrates the process of charging solder powders in the opening of the thermosetting adhesive layer at normal temperature;

(d) illustrates the process of preparing a second double-sided wired circuit board separately;

(e) illustrates the process of laminating one of second conductor layers of the second double-sided wired circuit board on the thermosetting adhesive layer including the opening filled with the solder powders and bonding together the first double-sided wired circuit board and the second double-sided wired circuit board through the thermosetting adhesive layer; and (f) illustrates the process of melting the solder powders by heating to form the conductive passage, FIG. 2 illustrates details of a principal part of the production process of the multilayer wired circuit board producing method shown in FIG. 1:

(a) illustrates the process of preparing the first double-sided wired circuit board;

(b) illustrates the process of forming the thermosetting adhesive layer on one of the first conductor layers of the first double-sided wired circuit board;

(c) illustrates the process of forming the opening in the thermosetting adhesive layer;

(d) illustrates the process of printing the solder paste prepared by mixing the solder powders in a solvent on the thermosetting adhesive layer through a metal mask;

(e) illustrates the process of removing the solvent from the solder paste by drying;

(f) illustrates the process of pressuring the solder powders at normal temperature;

(g) illustrates the process of peeling a separator and removing it from the thermosetting adhesive layer, together with the surplus solder powders overcharged in the opening;

(h) illustrates the process of disposing hot pressing devices at opposite sides of the first double-sided wired circuit board and the second double-sided wired circuit board;

(i) illustrates the process of pressing and/or heating the double-sided circuit boards; and (j) illustrates the process of melting the solder powders by heating to form the conductive passage, FIG. 3 illustrates details of a principal part of the multilayer wired circuit board producing method shown in FIG. 1, illustrating the processes as an alternative to the processes of (d) to (g) of FIG. 2, for charging the solder powders in the opening of the thermosetting layer:

(d) illustrates the process of printing an adequate quantity of (substantial quantity of) solder paste for the opening under normal temperature, with the separator as the mask;

(e) illustrates the process of removing the solvent from the solder paste by drying; and (f) illustrates the process of peeling the separator from the thermosetting adhesive layer, and FIG. 4 illustrates details of a principal part of the production process of a conventional multilayer wired circuit board producing method:

(a) illustrates the process of preparing the first double-sided wired circuit board;

(b) illustrates the process of laminating the thermosetting adhesive layer on the first conductor layer of the first wired circuit board;

(c) illustrates the process of forming the opening in the thermosetting adhesive layer;

(d) illustrates the process of screen-printing the solder paste on the opening;

(e) illustrates the process of forming the solder bump by melting the solder paste by heating;

(f) illustrates the process of laminating the second conductor layer of the second wired circuit board on the thermosetting adhesive layer in the state of being opposed to the solder bump; and (g) illustrates the process of bonding together the first double-sided wired circuit board and the second double-sided wired circuit board through the thermosetting adhesive layer.

DESCRIPTION OF THE INVENTION

FIG. 1 illustrates an embodiment of the production process of the multilayer wired circuit board producing method of the present invention. FIG. 2 illustrates the details of a principal part of the production process of the method. The illustrations of FIG. 2 are depicted as sectional views as viewed from the direction orthogonal to the direction from which the illustrations of FIG. 1 are viewed. In the following, an embodiment of the multilayer wired circuit board producing method of the present invention will be described with reference to FIGS. 1 and 2.

In the first process of this method, a first double-sided wired circuit board 13, which comprises first conductor layers 12 formed in the form of a specific wired circuit pattern on both sides of a first insulating layer 11, respectively, is prepared, as shown in FIG. 1(a) and FIG. 2(a).

No particular limitation is imposed on the materials of the first insulating layer 11, as long as they are commonly used for the insulating layer of the wired circuit board. For example, films of synthetic resins, such as a polyimide resin, an acrylic resin, a polyether nitrile resin, a polyether sulfonic resin, a polyester resin, a polyethylene naphthalate resin, and a polyvinyl chloride resin may be used as the insulating layer 11. Preferably, the film of the polyimide resin is used. The first insulating layer 11 is usually formed to have thickness of 9–100 $\mu$m, or preferably 9–35 $\mu$m.

No particular limitation is imposed on the materials of the first conductor layer 12, as long as they are commonly used for the conductor layer of the wired circuit board. For example, foils of metals, such as copper, nickel, gold, solder or their alloys may be used for the first conductor layers 12. Preferably, the foil of copper is used. Each of the first conductor layers 12 usually has thickness of 9–50 $\mu$m, or preferably 9–25 $\mu$m. The first conductor layers 12 are formed in the form of a specific wired circuit pattern on both sides of the first insulating layer 11 respectively by a known patterning process, such as a subtractive process, an additive process or a semi-additive process.

The first double-sided wired circuit board 13 has first through holes 31 bored in the first insulating layer 11 to extend through it in a thickness direction thereof The first through holes 31 are plated with metal, such as copper, nickel, gold, solder, or alloys thereof, to form first through-hole plated layers 32 for electrically connecting between the first conductor layers 12 formed at both sides of the first insulating layer 11. The first through-hole plated layers 32 are formed to be continuous to the first conductor layers 12.

Sequentially, the thermosetting adhesive layer 15 is formed in the B-stage state on one of the first conductor layers 12 of the first double-sided wired circuit board 13. The opening 14 is then formed in the thermosetting adhesive layer 15, as shown in FIG. 1(b) and FIGS. 2(b)–(c).

No particular limitation is imposed on the thermosetting adhesive 15, as long as it can be usually used for the adhesive layer of the wired circuit board and can be put into the B-stage state (the state in which the thermosetting adhesive is cured to such an extent that the adhesive layer can be held in its specific form). For example, acrylic adhesive, epoxy adhesive, amideimide adhesive, polyimide adhesive, and blended adhesives thereof can be cited as the thermosetting adhesive. The thermosetting adhesive usually has thickness of 25–100 $\mu$m, or preferably 40–60 $\mu$m.

Also, the thermosetting adhesive 15 to be cured in temperature of not less than 100° C., or preferably 125–200° C., is preferably used.

The thermosetting adhesive layer 15 can be formed in the B-stage state on the first conductor layer 12 in the following manner, for example. As shown in FIG. 2(b), after solution containing the thermosetting adhesive is applied to the first conductor layer 12, the solution is dried by heating so that the adhesive can be put into the B-stage state at the same time as the solution is dried. Alternatively, an adhesive sheet comprising thermosetting adhesive previously put in the B-stage state may be laminated on (temporarily bonded to) the first conductor layer 12 by application of heat thereto and/or by application of pressure thereon.

Also, the opening 14 may be formed in the thermosetting adhesive layer 15 in the following manner. For example, the opening 14 may be formed by boring the thermosetting adhesive layer 15, for example, by using laser, such as YAG laser, as shown in FIG. 2(c). The opening 14 is formed to extend through the thermosetting adhesive layer 15 in thickness direction thereof at a position in the first conductor layer 12 opposed to a connecting area with a second conductor layer 23 as mentioned later. Preferably, the opening 14 has a diameter of 50–300 μm, or preferably 50–200 μm, when formed in a circular shape, for example.

In this process, the opening 14 may be previously formed in the thermosetting adhesive layer 15 before the thermosetting adhesive layer 15 is formed on the first conductor layer 12, rather than after the thermosetting adhesive layer 15 is formed on the first conductor layer 12. The thermosetting adhesive layer 15 having the opening 14 previously formed may be formed on the first conductor layer 12, for example, by boring the adhesive sheet comprising the thermosetting adhesive to form the opening 14 in it with a drill, a punch or the like, first, and then laminating the adhesive sheet having the opening 14 on the first conductor layer 12, to form the thermosetting adhesive layer 15. For example, when viewed in FIG. 2, this process could be depicted in the step FIG. 2(a) and the step FIG. 2(c), skipping the step FIG. 2(b).

In the processes shown in FIGS. 2(b)–(c), in order to keep the thermosetting adhesive layer 15 from the solder powders 17 adhering to its unwanted locations in the solder powder 17 charging process mentioned later, a separator 16 is preferably laminated on a surface of the thermosetting adhesive layer 15 on its side opposite to the side thereof contacting with the first conductor layer 12.

Synthetic resin films, such as a polyester resin film, a polyethylene naphthalate resin film, and a polyimide resin film, may be used as the separator 16. The separator 16 has thickness of 7.5–50 μm. The separator 16 is bonded to the surface of the thermosetting adhesive layer 15 before the opening 14 is formed therein and, then, the separator 16 and the thermosetting adhesive layer 15 are both bored to form the opening 14 in both of them.

Then, the solder powders 17 are charged in the opening 14 of the thermosetting adhesive layer 15 at temperature of 5–50° C., as shown in FIG. 1(c) and FIGS. 2(d)–(g).

Although no particular limitation is imposed on the solder powders 17, for example binary compositions comprising Sn/Ag, Sn/Cu, Sn/Sb and Sn/Zn, and multiple compositions comprising Sn/Ag/Cu and Sn/Ag/Cu/Bi, can be cited as the solder powders that can be used. The solder powders 17 having an average particle diameter of not more than 50 μm, or preferably not more than 20 μm, are preferably used.

The solder powders 17 are charged in the opening 14 of the thermosetting adhesive layer 15 at temperature of 5–50° C. in the following manner. First, the solder powders 17 are mixed in the solvent 18 to prepare the solder paste 19. Then, after the metal mask 20 is disposed on the thermosetting adhesive layer 15, the solder paste 19 is printed on the thermosetting adhesive layer 15 through the metal mask 20 at temperature of 5–50° C., or preferably 10–30° C., or specifically under normal temperature, as shown in FIG. 2(d). It should be noted that the phrase of "under normal temperature" is intended to mean "in an atmosphere of room temperature without heating".

Although no particular limitation is imposed on the solvent 18, the solvent 18 that can be removed by drying in the temperature range of 75° C. to 200° C., or preferably 75° C. to 160° C., in the next drying process should preferably be selected. When the solvent that can be dried at temperature lower than 75° C. is selected, storage stability and continuous printability of the solder paste 19 may deteriorate. On the other hand, when the solvent that can be dried at temperature higher than 200° C. is selected, the thermosetting adhesive layer 15 may be cured in the drying process to such an extent that the adhesion strength of the interface between the thermosetting adhesive layer 15 and the second conductor layer 23 mentioned later may deteriorate.

More specifically, the solvent 18 prepared by adding e.g. amide resin to aliphatic alcohol to provide viscosity improvement effects is preferably used. The amount of amide resin added is in the approximate ratio of 0.005–5% to solder powder 17 by volume.

The solder paste 19 can be prepared, for example, by mixing the solder powders 17 and the solvent 18 to be in the approximate ratio of 1:0.5–2 by volume.

The metal mask 20 is formed in a specific pattern corresponding to the opening 14. The metal mask 20 is disposed on the thermosetting adhesive layer 15 and an excessive amount of solder paste 19 for the opening 14 is printed on the opening 14 from above the metal mask 20.

Sequentially, the solvent 18 is removed by drying, as shown in FIG. 2(e). The solvent 18 can be dried and removed, for example, by heating it at temperature of 75–200° C., or preferably 75–160° C., as mentioned above, for an adequate time. The drying time may be determined properly, depending on the amount of solder paste 19 to be charged in the opening 14 and the size of the first double-sided wired circuit board 13. However, an excessively short drying time causes the solvent to remain in the solder paste, so that the remaining solvent may be out-gassed by heating to cause a possible conductive failure. On the other hand, an excessively long drying time causes the thermosetting adhesive layer 15 to be cured to such an extent that the adhesion strength of the interface between the thermosetting adhesive layer 15 and the second conductor layer 23 mentioned later may deteriorate. From this point of view, the drying time is preferably in the range of 1 to 5 minutes, for example.

Then, the solder powders 17 are pressed at temperature of 5–50° C., or preferably 10–30° C., or specifically under normal temperature, as shown in FIG. 2(f). The application of pressure on the solder powders 17 can be done by pressing a pressurizer 21, such as a press or a pressure roller, from above the solder powders 17 at 0.5–10 MPa for 1 second to 5 minutes, for example. As a result of the application of pressure, the solder powders 17 are deformed and charged in the opening 14 in high density. It is preferable that the pressure is applied on the solder powders 17 so that the pressed solder powders 17 in the opening 14 can have a volume ratio of 40–99%. When the volume ratio of the solder charged in the opening 14 is less than 40%, the solder powders 17 is low in adhesion. On the other hand, when the volume ratio of the solder powders 17 charged in the opening 14 is more than 99%, the pressure as high as 100 MPa must be applied on the solder powders 17, so that there is the possibility that the first double-sided wired circuit board 13 may be cracked.

In this solder powders 17 charging process, all operations, except the operation of removing the solvent 18 by drying, are performed at temperature of 5–50° C., or preferably 10–30° C., or specifically under normal temperature.

Thereafter, the separator 16 is peeled off and removed together with the surplus solder powders 17 flowing over the opening 14, as shown in FIG. 2(g). This can allow the solder powders 17 to be charged in the opening 14 in a simple and reliable manner.

In place of the processes shown in FIGS. 2(d)–(g), alternative processes, such as those shown in FIGS. 3(d)–(f), may be taken to charge the solder powders 17 in the opening 14 of the thermosetting adhesive layer 15. Specifically, with the separator 16 as the mask, an adequate quantity of (substantial quantity of) solder paste 19 for the opening 14 is printed at temperature of 5–50° C., or preferably 10–30° C., or specifically under normal temperature, as shown in FIG. 3(d). Then, after the solvent 18 is removed by drying in the same manner as in the above, as shown in FIG. 3(e), the separator 16 is peeled off without applying any pressure on the solder powders 17 to allow the solder powders 17 to be charged in the opening 14, as shown in FIG. 3(f).

Sequentially, in this method, a second double-sided wired circuit board 24, which comprises the second conductor layers 23 formed in a specific wired circuit pattern on both sides of a second insulating layer 22, respectively, is prepared separately, as shown in FIG. 1(d). As shown in FIG. 1(e) and FIGS. 2(h)–(i), one of the second conductor layers 23 of the second double-sided wired circuit board 24 is laminated on the thermosetting adhesive layer 15 including the opening 14 filled with the solder powders 17.

The same layers as the first insulating layer 11 and the first conductor layer 12 may be used as the second insulating layer 22 and the second conductor layer 23. In the second double-sided wired circuit board 24, in which the second conductor layers 23 are formed in a specific wired circuit pattern on both sides of the second insulating layer 22, respectively, as is the case of the first double-sided wired circuit board 13, the second conductor layers 23 are electrically connected with each other through second through-hole plated layers 34 formed in second through holes 33 extending through the second insulating layer 22 in a thickness direction thereof.

Then, one of the second conductor layers 23 of the second double-sided wired circuit board 24 is positioned to be opposed to the opening 14 and is laminated on the thermosetting adhesive layer 15. The lamination can be done, for example, by using heating/pressing devices 25, such as hot pressing devices or hot pressing rolls, which are located opposite the first double-sided wired circuit board 13 and the second double-sided wired circuit board 24, respectively, as shown in FIG. 2(h), to press and/or heat them, as shown in FIG. 2(i). The conditions for the pressuring and/or the heating may be determined properly, depending on the size of the first double-sided wired circuit board 13 and that of the second double-sided wired circuit board 24. It is preferable that the first double-sided wired circuit board 13 and the second double-sided wired circuit board 24 are pressed at pressure of 1–10 MPa, or preferably 3–5 MPa, and/or at temperature of 160–225° C., or preferably 175–200° C., for example. By this pressuring and/or the heating, the thermosetting adhesive layer 15 which is in the B-stage state is cured and, as a result of this, the second double-sided wired circuit board 24 is bonded to and laminated onto the first double-sided wired circuit board 13 through the thermosetting adhesive layer 15.

Thereafter, as shown in FIG. 1(f) and FIG. 2(j), the solder powders 17 are melted by heating to form a conductive passage 26 for electrically connecting between the first conductor layer 12 and the second conductor layer 23 confronting each other. After these processes, a multiple-layered (four-layered) wired circuit board 27 is produced.

The temperature required for the solder powders 17 to be melted by heating is set to be higher than the melting temperature of the solder powders 17 used. It is preferable that the solder powders 17 are melted not only by the application of heat thereto but also by the application of pressure thereon at 1–10 MPa, or preferably 3–5 MPa.

The curing of the thermosetting adhesive layer 15 and the melting of the solder powders 17 by heating may be taken sequentially in separate processes or may alternatively be taken simultaneously in the same process by selecting the conditions therefor properly.

In this method, after the solder powders 17 are charged in the opening 14 of the thermosetting adhesive layer 15 at temperature of 5–50° C., or preferably 10–30° C., or specifically at normal temperature, the second conductor layer 23 is laminated on the thermosetting adhesive layer 15. More specifically, in the solder powders 17 charging process, the second conductor layer 23 is laminated on the thermosetting adhesive layer 15 in the condition in which the curing of the thermosetting adhesive layer 15 is prevented as much as possible in the heat history for the solvent 18 to be removed from the solder paste 19 by drying (the heat history at high temperature in excess of 50° C.). Thus, the thermosetting adhesive layer 15 and the second double-sided wired circuit board 24 including the second conductor layer 23 are already laminated with each other when the solder powders 17 are melted by heating in a later stage. Hence, even when the thermosetting adhesive layer 15 is reactively cured further by the melting of the solder powders 17 by heating, the adhesion strength of the interface between the thermosetting adhesive layer 15 and the second double-sided wired circuit board 24 including the second conductor layer 23 increases as the curing of the thermosetting adhesive layer 15 proceeds. As a result of this, sufficient adhesion strength of the interface between the second double-sided wired circuit board 24 including the second conductor layer 23 and the thermosetting adhesive layer 15 is ensured. Consequently, improved interlayer connection strength between the first conductor layer 12 and the second conductor layers 23 confronting each other is provided and thus reduced interlayer conductive failure is provided, thus enabling a multilayer wired circuit board 27 to be produced with high reliability and in a simple and reliable manner.

Although the embodiments in which the second double-sided wired circuit board 24 is laminated on the first double-sided wired circuit board 13 has been illustrated above, no particular limitation is imposed on the number of wired circuit boards laminated. Also, single-sided wired circuit boards may be laminated, in place of the double-sided wired circuit boards.

EXAMPLES

While in the following, the present invention will be described in further detail with reference to Examples and Comparative Examples, the present invention is not limited to any Examples and Comparative Examples.

Example 1

The first double-sided wired circuit board, which comprises the first conductor layers comprising copper foils having thickness of 18 μm formed in the form of a specific wired circuit pattern on both sides of the first insulating layer comprising polyimide resin having thickness of 13 μm, respectively, was prepared (See FIG. 1(a) and FIG. 2(a)). The first double-sided wired circuit board has the first through holes bored in the first insulating layer to extend through it in a thickness direction thereof. The first through holes were plated with copper to form the first through-hole plated layers for electrically connecting between the first conductor layers.

Sequentially, after the thermosetting adhesive layer comprising the adhesive sheet of acrylic adhesive having thickness of 50 μm was laminated on (temporarily bonded to) one of the first conductor layers of the first double-sided wired circuit board by using a vacuum press at 50° C. under pressure of 1.5 MPa (See FIG. 2(b)), the opening having the diameter of 150 μm was formed in a specified area of the thermosetting adhesive layer (where the first conductor layer and the second conductor layer are connected with each other) by using the YAG laser (See FIG. 1(b) and FIG. 2(c)).

Then, after the metal mask formed in a specific pattern corresponding to the opening was set in place on the thermosetting adhesive layer, the solder paste was printed on the thermosetting adhesive layer through the metal mask (See FIG. 2(d)). The solder paste used was prepared by mixing the solder powders comprising Sn/Ag having an average particle diameter of 20 μm, alcohols solvent, and amide resin in the ratio of 50:49:1 by volume.

Then, after the solvent was dried and removed by heating at 160° C. for 5 minutes (FIG. 2(e)), the solder powders were pressed under normal temperature at 5 MPa for 5 minutes (FIG. 2(f)) and then the surplus solder powders were removed (See FIG. 1(c) and FIG. 2(g)).

Sequentially, the second double-sided wired circuit board, which comprises the second conductor layers comprising copper foils having thickness of 18 μm formed in the form of a specific wired circuit pattern on both sides of the second insulating layer comprising polyimide resin having thickness of 13 μm, respectively, was prepared separately (See FIG. 1(d)). The second double-sided wired circuit board has the second through holes bored in the second insulating layer to extend through it in a thickness direction thereof. The second through holes were plated with copper to form the second through-hole plated layers for electrically connecting between the second conductor layers.

Then, after one of the second conductor layers of the second double-sided wired circuit board was positioned to be opposed to the opening (FIG. 2(h)), it was heated at 200° C. under pressure of 5 MPa for 30 minutes, to be laminated on the thermosetting adhesive layer (See FIG. 1(e) and FIG. 2(i)).

Thereafter, the solder powders were melted by heating at 250° C. under pressure of 5 MPa for 3 minutes, to form the conductive passage for electrically connecting between the first conductor layer and the second conductor layer confronting each other. After these processes, the four-layered wired circuit board was produced (See FIG. 1(f) and FIG. 2(j)).

Example 2

The first double-sided wired circuit board was prepared in the same operations as in Example 1 (See FIG. 1(a) and FIG. 2(a)).

Sequentially, after the separator comprising polyester resin film having thickness of 12 μm was laminated on (temporarily bonded to) one of the first conductor layers of the first double-sided wired circuit board through the thermosetting adhesive layer comprising the adhesive sheet of acrylic adhesive having thickness of 50 μm by using the vacuum press at 50° C. under pressure of 1.5 MPa (See FIG. 2(b)), the opening having the diameter of 150 μm φ was formed in specified areas of the separator and the thermosetting adhesive layer (where the first conductor layer and the second conductor layer are connected with each other) by using the YAG laser (See FIG. 1(b) and FIG. 2(c)).

Sequentially, with the separator as the mask, an adequate quantity of (substantial quantity of) solder paste identical with that of Example 1 for the opening was printed under normal temperature (See FIG. 3(d)). Then, after the solvent was dried and removed by heating at 160° C. for 5 minutes (FIG. 3(e)), the separator was peeled off without applying any pressure on the solder powders (FIG. 3(f)), so that the solder powders were filled in the opening.

Then, the second double-sided wired circuit board was prepared separately in the same operations as in Example 1 (See FIG. 1(d)). Then, after one of the second conductor layers of the second double-sided wired circuit board was positioned to be opposed to the opening (FIG. 2(h)), it was heated at 200° C. under pressure of 5 MPa for 30 minutes, to be laminated on the thermosetting adhesive layer (See FIG. 1(e) and FIG. 2(i)).

Thereafter, the solder powders were melted by heating at 250° C. under pressure of 5 MPa for 3 minutes, to form the conductive passage for electrically connecting between the first conductor layer and the second conductor layer confronting each other. After these processes, the four-layered wired circuit board was produced (See FIG. 1(f) and FIG. 2(j)).

Comparative Example 1

The same operations as those of Example 1 were performed, whereby the first double-sided wired circuit board was prepared, first, and, then, after the thermosetting adhesive layer was laminated on (temporarily bonded to) one of the first conductor layers, the opening was formed therein.

Sequentially, the solder paste containing the solder powders comprising Sn/Ag having an average particle diameter 20 μm were screen-printed on the opening. Thereafter, the solder paste was melted by heating at ultimate temperature of 250° C. by using a reflow device, to form the solder bump. Thereafter, the residue of flux was cleaned by using an aqueous cleansing agent.

Then, the second double-sided wired circuit board was prepared separately in the same operations as in Example 1. Then, after one of the second conductor layers of the second double-sided wired circuit board was positioned to be opposed to the opening, it was heated at 200° C. under pressure of 5 MPa for 30 minutes, to be laminated on the thermosetting adhesive layer. Thereafter, the lamination was further heated at 250° C. under pressure of 5 MPa for 3 minutes, to obtain the four-layered wired circuit board.

Evaluation

1) Adhesion Strength Test

The four-layered wired circuit boards of Examples 1 and 2 and Comparative Example 1 were evaluated by a 90° peel test on the adhesion strength of the thermosetting adhesive layers to the second conductor layers. The test results are shown in TABLE 1.

TABLE 1

|  | 90° peel strength |
| --- | --- |
| Example 1 | 1.2 kN/m |
| Example 2 | 1.2 kN/m |
| Comparative Example 1 | 0.3 kN/m |

It is clearly seen from Table 1 that Examples 1 and 2 are higher in adhesion strength than Comparative Example 1.

2) Solder Dip Test

The four-layered wired circuit boards of Examples 1 and 2 and Comparative Example 1 were evaluated by a solder dip test (260° C., 10 sec.) to measure changes in resistance. The test results are shown in TABLE 2.

TABLE 2

| (Unit: Ω) | | | | |
| --- | --- | --- | --- | --- |
|  | Initial stage | 1st stage | 2nd stage | 3rd stage |
| Example 1 | 5.05 | 5.04 | 5.03 | 5.03 |
| Example 2 | 5.07 | 5.08 | 5.08 | 5.08 |
| Comparative Example 1 | 5.15 | >1000 | — | — |

In the four-layered wired circuit board of Comparative Example 1, the adhesion strength of the interface between the second conductor layer and the thermosetting adhesive layer was low, so that the solder flowed into the interface therebetween to cause the electrical conductive failure in the solder dip test. On the other hand, in the four-layered wired circuit boards of Examples 1 and 2, improvement in adhesive strength of the interface between the second conductor layer and the thermosetting adhesive layer was obtained, so that the resistance change was kept in an error range of ±10% and improvement in reflow soldering was obtained.

While the illustrative embodiments of the present invention are provided in the above description, such is for illustrative purpose only and it is not to be construed restrictively. Modification and variation of the present invention that will be obvious to those skilled in the art is to be covered by the following claims.

Capabilities of Exploitation in Industry

The method of producing a multilayer wired circuit board according to the present invention provides a useful method of producing a multilayer wired circuit board that can reduce interlayer conductive failure to provide improved reliability.

What is claimed is:

1. A method of producing a multilayer wired circuit board, the method comprising:

providing a wired circuit board having a first conductor layer, said board containing at least one first opening therein;

one of forming a thermosetting adhesive layer having at least one second opening previously formed therein, on said first conductor layer, and forming the thermosetting adhesive layer on said first conductor layer, followed by forming said at least one second opening in the thermosetting adhesive layer;

charging solder powders in the second opening at a temperature of 5–50° C.;

applying a second conductor layer on the thermosetting adhesive layer including the second opening filled with the solder powders; and melting the solder powders by heating to electrically connect between the first conductor layer and the second conductor layer.

\* \* \* \* \*